(12) United States Patent
Nguyen et al.

(10) Patent No.: US 11,021,786 B2
(45) Date of Patent: Jun. 1, 2021

(54) COPPER PASSIVATION

(71) Applicant: Texas Instruments Incorporated, Dallas, TX (US)

(72) Inventors: Luu Thanh Nguyen, San Jose, CA (US); Mahmud Halim Chowdhury, Richardson, TX (US); Ashok Prabhu, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 108 days.

(21) Appl. No.: 16/209,513

(22) Filed: Dec. 4, 2018

(65) Prior Publication Data

US 2020/0173013 A1 Jun. 4, 2020

(51) Int. Cl.
| | | |
|---|---|---|
| *H01L 21/3205* | (2006.01) | |
| *C23C 14/12* | (2006.01) | |
| *C23F 11/10* | (2006.01) | |
| *H01L 21/288* | (2006.01) | |
| *H01L 21/768* | (2006.01) | |

(52) U.S. Cl.
CPC ............. *C23C 14/12* (2013.01); *C23F 11/10* (2013.01); *H01L 21/288* (2013.01); *H01L 21/3205* (2013.01); *H01L 21/76838* (2013.01)

(58) Field of Classification Search
CPC .......................... H01L 21/288; H01L 21/3205
See application file for complete search history.

(56) References Cited

U.S. PATENT DOCUMENTS

| | | |
|---|---|---|
| 6,383,928 B1 | 5/2002 | Eissa |
| 6,908,851 B2 | 6/2005 | Leng et al. |
| 7,144,802 B2 | 12/2006 | Xia et al. |
| 7,550,046 B2 | 6/2009 | Xia et al. |
| 2006/0270233 A1 | 11/2006 | Xia et al. |
| 2015/0267310 A1* | 9/2015 | Ikumoto ............. H05K 3/4007 205/125 |
| 2016/0107289 A1* | 4/2016 | Cavanaugh ............. C09G 1/02 216/53 |
| 2017/0069558 A1* | 3/2017 | Bang .................. H01L 23/3128 |
| 2018/0247887 A1* | 8/2018 | Park .................. H01L 23/49838 |

FOREIGN PATENT DOCUMENTS

EP  1465245 B1  9/2016

OTHER PUBLICATIONS

Matjaz Finsgar, "2-Mercaptobenzimidazole as a copper corrosion inhibitor: Part I. Long-term immersion, 3D-profilometry, and electrochemistry," Corrosion Science 72 (2013) pp. 82-89, Mar. 18, 2013.

(Continued)

*Primary Examiner* — Errol V Fernandes
(74) *Attorney, Agent, or Firm* — Ronald O. Neerings; Charles A. Brill; Frank D. Cimino (57) ABSTRACT

In a described example, a method for passivating a copper structure includes: passivating a surface of the copper structure with a copper corrosion inhibitor layer; and depositing a protection overcoat layer with a thickness less than 35 μm on a surface of the copper corrosion inhibitor layer.

38 Claims, 10 Drawing Sheets

(56) References Cited

OTHER PUBLICATIONS

Loto et. al., "Corrosion inhibition of thiourea and thiadiazole derivatives: A Review", J. Mater. Environ. Sci. 3 (5) (2012) pp. 885-094, Jun. 11, 2012, accessed Nov. 16, 2018 at the uniform resource locator (URL) address: https://www.jmaterenvironsci.com/Document/vol3/vol3_N5/90-JMES-241-2012-Loto-Review.pdf.
M. M. Antojovec, "Copper Corrosion Inhibitors. A review", Int. J. Electrochem. Sci., 3 (2008) 1-28, online publication Nov. 20, 2007; accessed Nov. 16, 2018 at uniform resource locator (URL) address: https://www.researchgate.net/publication/26495183_Copper_Corrosion_Inhibitors_A_review.
Marija B. Petrovic Mihajlovic, Milan M. Antonijevic, "Copper Corrosion Inhibitors. Period 2008-2014. A Review", Int. J. Electrochem. Sci., 10 (2015) pp. 1027-1953, Dec. 16, 2014.
B. Sanyal, "Organic Compounds As Corrosion Inhibitors in Different Environments—A Review", Progress in Organic Compounds, 9 (1981), pp. 165-236, The Netherlands 2018.

\* cited by examiner

COPPER PASSIVATION

TECHNICAL FIELD

This disclosure relates generally to passivating copper.

BACKGROUND

Copper and copper alloys are used as interconnects between devices on semiconductor wafers and on substrates for mounting electronic devices and for interconnecting devices with conductive traces, such as on printed circuit boards. When copper is exposed to an ambient environment for an extended period of time, the surface of the copper corrodes. When corrosion exists on leads on a printed circuit board or in a packaged integrated circuit, stress from an applied voltage can result in leakage current. This leakage current can increase over time and can lead to catastrophic shorting.

SUMMARY

In a described example, a copper structure on a substrate has a copper corrosion inhibitor layer coated with a protection layer less than 35 μm thick. In described examples the protective layer is a polymer deposited by ink jet deposition. In additional described examples the protection is a polymer layer deposited by screen print deposition or slit print deposition. A method for passivating a copper structure a copper corrosion inhibitor layer and a protection layer less than 35 μm thick over the copper corrosion inhibitor layer is described.

DETAILED DESCRIPTION

Corresponding numerals and symbols in the different figures generally refer to corresponding parts unless otherwise indicated. The figures are not necessarily drawn to scale.

In this description, the term "semiconductor die" is used. As used herein, "semiconductor die" means a die formed using semiconductor material. Examples include dies containing integrated circuits, where several and sometimes hundreds or thousands of transistors are formed and are coupled together using patterned conductors to perform a desired function. Additional examples include dies including passive devices such as resistors, capacitors, inductors and diodes formed on a semiconductor substrate. Discrete devices such as one, or a few, power field effect transistors (FETs), bipolar junction transistors (BJTs), rectifiers, and amplifiers formed on semiconductor substrates are also examples of semiconductor dies. Analog-to-digital converters, RF filters, transceivers, photocells, photodiodes, digital micromirror devices (DMDs), and transformers are additional examples of semiconductor dies. As used herein, a "packaged semiconductor device" is a semiconductor die that has been mounted on a substrate with leads or terminals for making electrical connections, and which is wholly or partially covered in mold compound.

In this description, the term "ink-jet deposition" is used for an example process of depositing material. As used herein, "ink jet deposition" means depositing material from a liquid in a reservoir that feeds a nozzle by forming drops in response to an electrical signal as the nozzle is moved with respect to a surface. An ink-jet deposition tool may have tens, hundreds or more nozzles. In printing, the material is ink, and the ink jet deposition process is referred to as "ink-jet printing". In deposition of materials in manufacturing, the liquid to be deposited can be referred to as "ink" and as used herein the term "ink" can include solder, dielectrics, conductive materials, adhesives, and polymers as used in the arrangements. Ink jet deposition allows precise placement of material by using "drop on demand" (DOD) technology, where a reservoir of the liquid has a nozzle, and a small volume of the liquid is forced from the nozzle in response to an electrical signal. The liquid forms a drop as it falls vertically onto a surface. The precision of the ink-jet deposition tool allows deposition of the liquid material in some areas and not in others as the tool traverses across the surface (or if the tool is fixed, as the surface moves beneath the tool). The reservoir can include a piezo-electric actuator that expels a known volume of ink through a nozzle in response to an electrical signal, or in a thermal ink jet deposition tool, the liquid can be heated quickly by a resistive element in the reservoir, and expand, forcing a known volume of liquid through the nozzle. The liquid forms drops that travel vertically to land on the surface that the material is deposited on. Because the material can be very accurately placed even in small areas, no etch or material removal step is needed to remove material after the ink-jet deposition. Also, the material is used very efficiently with little waste when compared to spin coating, screen print deposition or slit print deposition processes. Multiple ink-jet deposition passes can be used to build up a thicker layer of material.

In this description, the terms "screen print deposition" and "slit print deposition" are used. As used herein, screen print deposition means using a stencil to cover areas to be excluded from the deposition and dragging a liquid ink across the stencil, while openings in the stencil allowing deposition in those areas. As used herein, slit print deposition means using slits in a tool and moving the slits across the substrate as ink flows through the slits to deposit the material onto the substrate.

In the arrangements, a copper portion is described as being "passivated" or being subjected to "passivation." A passivated structure is one that is made more passive by the use of a protective layer. For example copper can be protected by use of a copper corrosion inhibitor and the resulting structure can be described as a "passivated copper" structure. In one example the copper corrosion inhibitor is BTA. Other copper corrosion inhibitors can also be used. Derivatives of BTA including BTAH and other derivatives can also be used. Copper corrosion inhibitors are described in "Copper Corrosion Inhibitors. A review", M. M. Antonijevic and M. B. Petrovic, International Journal Electrochemical Science, 3, pp. 1-28, (2008) (published online Nov. 20, 2007); which can be accessed at the uniform resource locator (URL) address on the world wide web at: https://www.researchgate.net/publication/26495183_Copper_Corrosion_Inhibitors_A_review/download; and which is hereby incorporated herein by reference.

In this description, the term "copper corrosion inhibitor" is used for these materials. As used herein, the term "copper corrosion inhibitor" includes materials known to reduce or prevent corrosion of copper. Useful copper corrosion inhibitor examples include azoles, for example, BTA and its derivatives. Other azoles can be used. Additional copper corrosion inhibitors include amines such as N-phenyl-1,4-phenylenediamine (NPPD), amino acids such as cysteine, valine, glycine, arginine, and lysine; nitrogen-containing organic compounds, including triphenylmethane derivatives, rosaniline chloride, and fuchsin acid sodium salt; thiole groups; and phosphate groups such as triethyl phosphate, and triphenyl phosphate. The selection of the copper corrosion inhibitor needs to be made with consideration of the requirements of subsequent processes that will be performed on the device, including thermal budgets. BTA can withstand temperatures above 260 degrees Celsius, a temperature used in thermal reflow of solder or solder bumps or balls for surface mount and assembly of devices. Some other copper corrosion inhibitors cannot withstand temperatures above 150 degrees Celsius, making BTA attractive for applications with higher temperature processing required after the copper corrosion inhibitor is applied.

In example arrangements the problem of corrosion of copper structures is solved by coating the copper structures with a copper corrosion inhibitor, and covering the copper and the copper corrosion inhibitor with a protective layer. The protective layer prevents chipping and damage to the copper corrosion inhibitor in subsequent handling and processing steps, preventing unwanted exposure of the copper structures and reducing or eliminating corrosion.

In the arrangements, substrates are used with copper structures thereon. In some examples the substrate is a semiconductor die. In alternative examples, useful substrates can include: lead frames of copper, copper alloys, or other conductive metals (such as Alloy 42 and stainless steel); molded interconnect substrates (MIS); pre-molded lead frames (PMLFs) with lead frame conductors and mold compound in a preformed structure; tape based and film-based substrates carrying conductors and insulators; laminate substrates with multiple layers of conductors and insulator layers; and printed circuit board substrates of ceramic, resin, or fiberglass, such as FR4.

Figure 1:
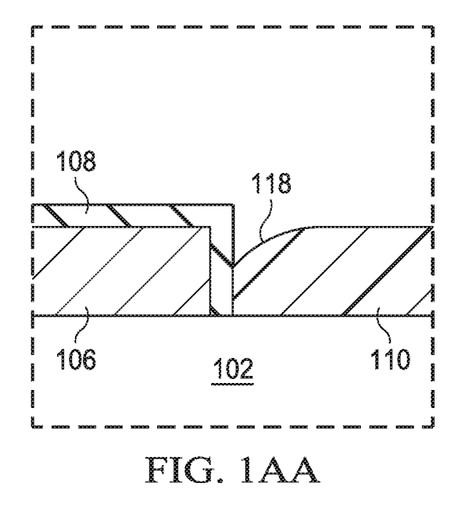
Figure 1A:
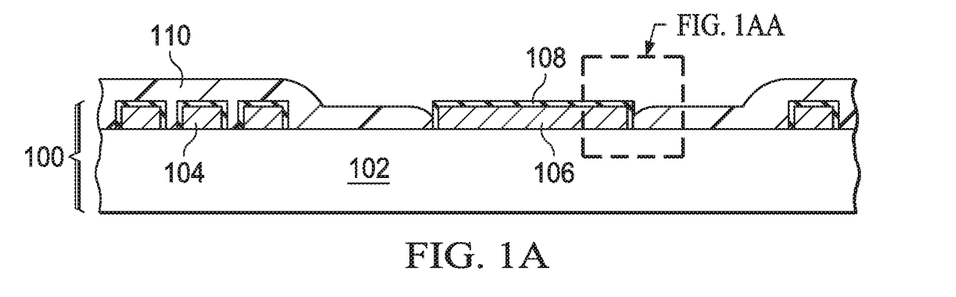
FIGS. 1A and 1AA are cross sectional depictions of copper leads coated with a protection layer deposited using ink-jet deposition.

FIGS. 1A and 1AA are cross sections illustrating substrates with copper structures that are passivated with a surface layer of copper corrosion inhibitor that is then covered with a polymer protection layer. In an example the copper corrosion inhibitor is benzotriazole (BTA) that is covered with a protection layer of polymer. In this example the polymer was deposited using ink-jet deposition. Use of the protection layer prevents damage to the copper corrosion inhibitor, increasing the reliability of the devices.

FIG. 1A shows in a cross-sectional view an assembly 100 including a substrate 102 with copper leads 104 and a copper bond pad 106. A surface layer 108 of a copper corrosion inhibitor covers at least portions of the surfaces of the copper leads 104 and the copper bond pad 106. In this example, the copper corrosion inhibitor layer 108 is benzotriazole (BTA). A protection layer 110 covers the copper corrosion inhibitor 108 on copper leads 104 and portions of the surface of the substrate 102. The protection layer 110 does not cover the bond pad 106. The substrate 102 can be a semiconductor die, another substrate carrying copper conductors, a semiconductor wafer, or in another example, can be a printed circuit board. The substrate 102 can also be any type of substrate with copper structures on the surface. The protection layer 110 can be an ink-jet deposition compatible polymer such as a polyimide ink, a thermally curable epoxy-based polymer ink, and a UV-curable acrylate ink. It is preferred that a polymer with a modulus less than 3.4 GPa and more preferred less than 2 GPa be used, to avoid undue stress on the assembly. A thickness of the protection layer 110 can be in the range of about 2 μm to 35 μm. A more preferred range is about 2 μm to not more than 20 μm, and still more preferred is a range from about 2 μm to about 10 μm. Because the ink jet deposition material has a solvent, the initial thickness of the layer when first deposited is greater than the final layer thickness, after the solvent dissipates, the remaining material forms the protective layer at a reduced thickness. To achieve the desired thickness, multiple ink jet depositions can be performed. A single pass deposition is more preferred to increase manufacturing throughput and reduce costs. As additional ink jet materials are developed, a reduction in the amount of solvent can reduce the initial thickness needed and thereby reduce the need for multiple pass depositions.

FIG. 1AA shows an expanded view of the sidewall 118 of protection layer 110. When a polymer layer is deposited using ink-jet deposition, multiple layers of the polymer are deposited to form the protective layer, each layer formed of drops of ink. After an anneal, this method produces a sidewall 118 on the protection layer 110 with a convex profile as is illustrated in the expanded view in FIG. 1AA.

Figure 2:
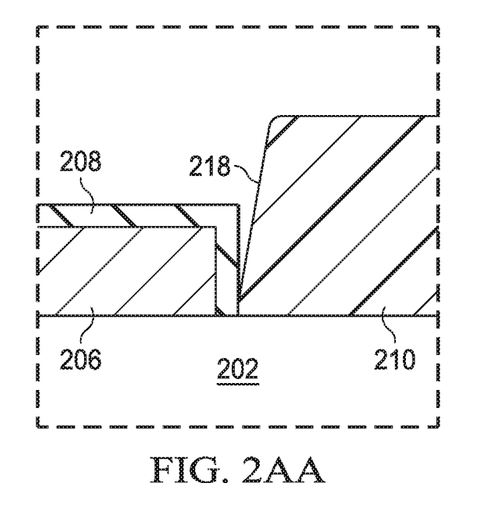
Figure 2A:
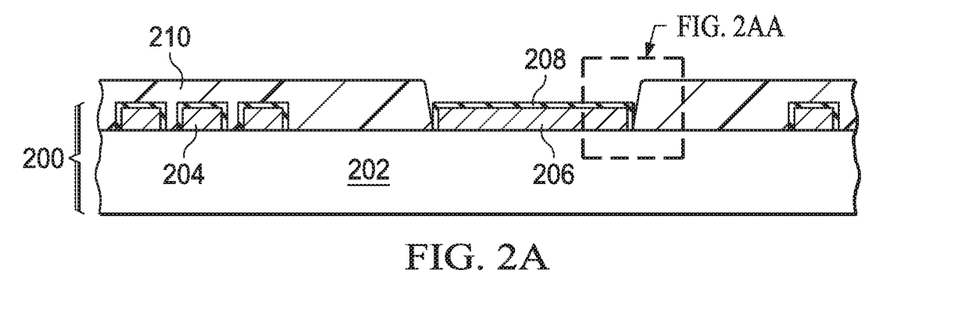
FIGS. 2A and 2AA are cross sectional depictions of copper leads coated with a protection layer deposited using screen print deposition or slit print deposition.

FIG. 2A shows in a cross sectional view an assembly 200 comprised of substrate 202 with copper leads 204 and a copper bond pad 206 similar to the structure in FIG. 1A. In FIGS. 2A and 2AA, similar reference labels are used for similar elements shown in FIGS. 1A and 1AA, for clarity. For example, substrate 202 in FIG. 2A corresponds to substrate 102 in FIG. 1A. The protection layer 210 in the example of FIGS. 2A and 2AA is a polymer deposited using screen print deposition or slit print deposition. Unlike the convex sidewall 118 formed using the ink-jet deposition method shown in FIG. 1AA, as is illustrated in the expanded view in FIG. 2AA, the sidewall 218 of the screen-print deposited or slit-print deposited protection layer 210 is straight and within about 20 degrees of vertical. (Vertical is the orientation perpendicular to the surface on which the polymer is deposited.) The protection layer 210 can be a screen-print compatible or slit print compatible polymer such as: a polyimide; a thermally curable epoxy-based polymer; a UV-curable acrylate polymer; or a silicone. It is preferred that a polymer with a modulus less than 3.4 GPa and more preferred less than 2 GPa be used, to avoid undo stress on the assembly. A thickness of the protection layer 210 can be in the range of about 2 µm to about 35 µm, more preferably 2 µm to not more than 20 µm, and most preferably in a range of 2 µm to 10 µm.

In alternative arrangements the protective layer can be deposited by spraying, spin coating, dispensing by other methods, and by vapor deposition. The material for the protective layer includes solvent, and so the protective layer is initially deposited at a thicker layer than the desired finished layer. In an example the material deposited for the protective layer is 60% solvent so that only 40% of the initial deposited material remains after a quick drying. Alternative materials can have a reduced solvent to material ratio, so that less initial thickness is needed for the same thickness final layer, as less solvent is dissipated. The material for the protective layer has light filler loading, for example 20-30% filler weight, which provides control of the viscosity, conformality, wettability, modulus and coefficient of thermal expansion (CTE). In comparison, mold compound used in some arrangements can be 90% filler weight, for transfer molding using solid mold compound heated in a mold press. Liquid resin for packaging can have 50-60% filler weight.

Cross sectional views in FIGS. 3A-3D illustrate example steps to manufacture the passivated copper structure depicted in FIG. 1A. In FIGS. 3A-3D similar reference labels are used for similar elements shown in FIG. 1A, for clarity. For example, substrate 302 in FIGS. 3A-3D corresponds to substrate 102 in FIG. 1A. The flow diagram of FIG. 4 illustrates corresponding method steps.

Figure 3A:
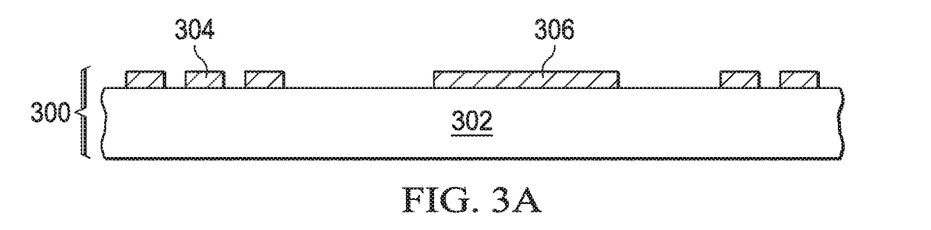
FIGS. 3A through 3D are cross sectional views illustrating the major steps in the process for protecting copper leads from corrosion.
Figure 4:
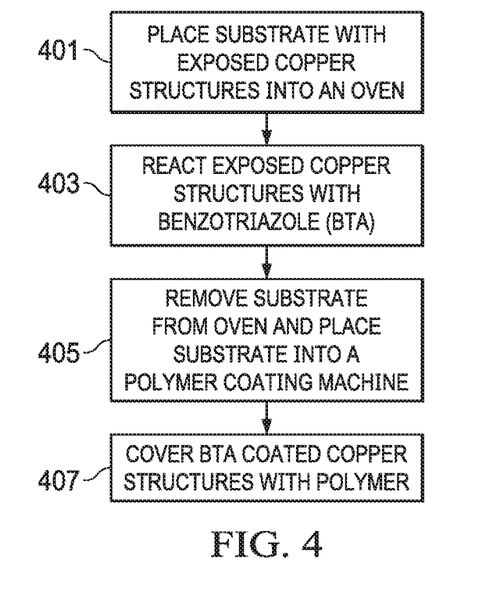
FIG. 4 is a flow diagram describing a process for protecting copper leads.

FIG. 3A shows an assembly comprised of a substrate 302 with exposed copper structures 304 and 306 on the surface. The substrate 302 can be any material with sufficient structural integrity to support the copper structures 304 and 306. The size of the assembly 300 is limited by the manufacturing equipment available to perform the process steps.

Figure 3B:
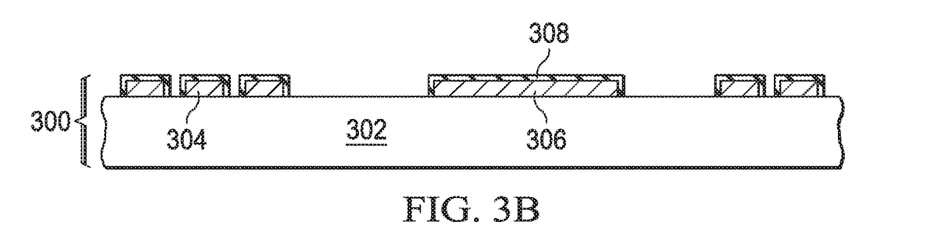

In FIG. 3B, the assembly is put into an oven (Step 401, FIG. 4) and the exposed surfaces of the copper are coated (Step 403, FIG. 4) with a copper corrosion inhibitor such as benzotriazole (BTA). The BTA coating process can be similar to the BTA coating process described in U.S. Pat. No. 7,550,046 which is hereby incorporated by reference herein. The BTA used preferably has a molecular weight sufficiently high so that the BTA film on the surface of the copper will not degrade or evaporate when a wire is soldered to one of the copper structures 304 and 306. A molecular weight where the BTA film 308 is stable to at least about 260° C. In an arrangement, the molecular weight of the BTA is 119.76 g/mole. In example arrangements the molecular weight of the BTA can range from about 120 g/mole to 200 g/mole.

Figure 3C:
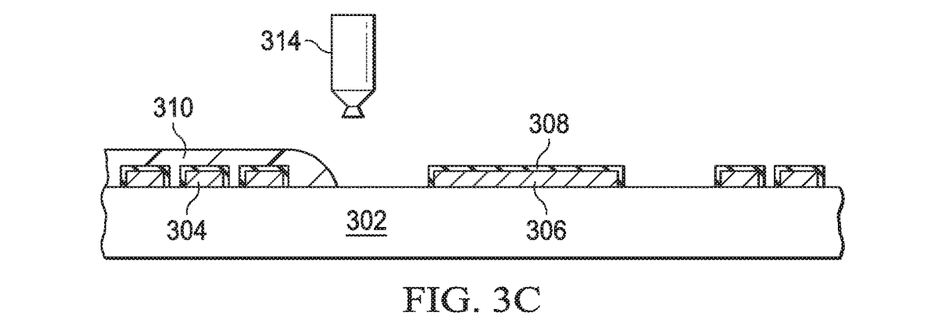

In FIG. 3C (Step 405, FIG. 4) the assembly 300 is removed from the BTA coating oven and placed into tool with an ink-jet deposition tool 314. The ink-jet deposition tool 314 deposits polymer ink over the copper structures 304 and on at least a portion of the surface of the substrate 302 surrounding the copper structures 304 to form protection layer 310. It may be desirable to leave the surface of some copper structures such a bond pads 306 uncovered. An exclusion zone around the uncovered copper structure 306 can be kept free of polymer to avoid polymer flow onto the uncovered copper structure 306 during subsequent processing steps such as thermal curing, UV-curing, or thermal annealing. In an arrangement, the exclusion zone is 30 µm. Because the ink jet deposition process allows precise placement of the polymer, the uncovered copper structure 306 can be excluded from the deposition pattern in ink jet deposition processes and no polymer is dropped thereon.

Figure 3D:
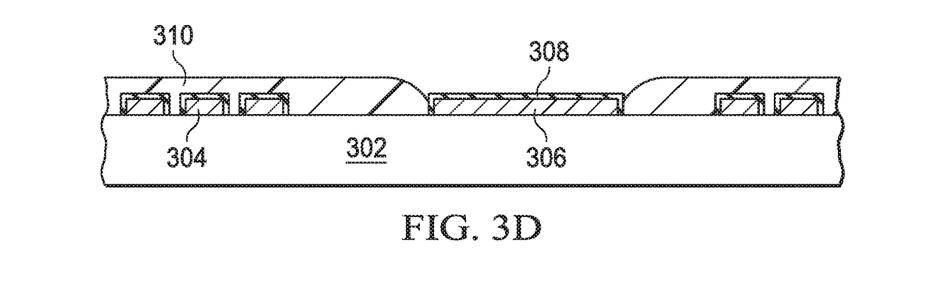

FIG. 3D shows the assembly 300 with the copper structures 304 and 306 with the copper 304 coated with BTA 308 and with the BTA and a portion of the surface of the substrate 302 covered with a protection layer 310. In this application, a portion of the surface of the BTA over copper structure 306 is left uncoated with the protection layer 310.

Figure 5A:
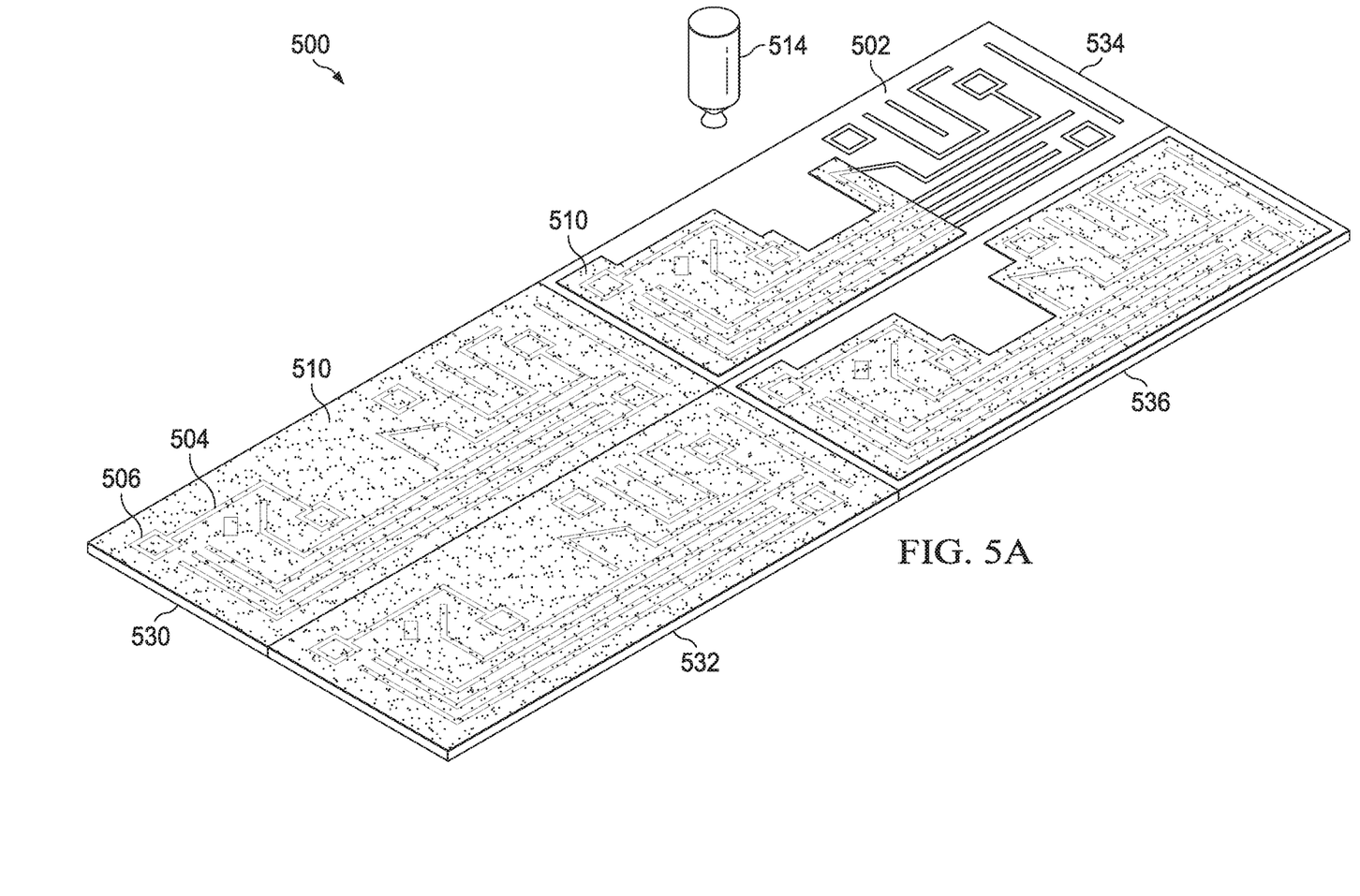
FIGS. 5A and 5B are projection views of an integrated circuit substrate with passivated copper leads and of a packaged integrated circuit substrate, respectively.

FIG. 5A shows an application where the assembly 500 is a printed circuit board (PCB) panel with copper leads 504 and bond pads 506 on a surface. In FIG. 5A similar reference labels are used for similar elements shown in FIG. 1A, for clarity. For example, substrate 502 in FIG. 5A corresponds to substrate 102 in FIG. 1A. The PCB panel is comprised of four identical PCBs, 530, 532, 534, and 536. After the exposed copper leads 504 and bondpads 506 are coated with a copper corrosion inhibitor, for example BTA, the BTA over the copper structures is covered with protection layer 510 using an ink-jet deposition tool 514. In this application, the entire surface of PCBs 530 and 532 is covered with the protection layer 510. In this application, a first portion of the surface of PCBs 534 and 536 is covered with the protection layer 510 and a second portion of the surface is of each of the PCBs 534 and 536 is left uncovered.

Figure 5B:
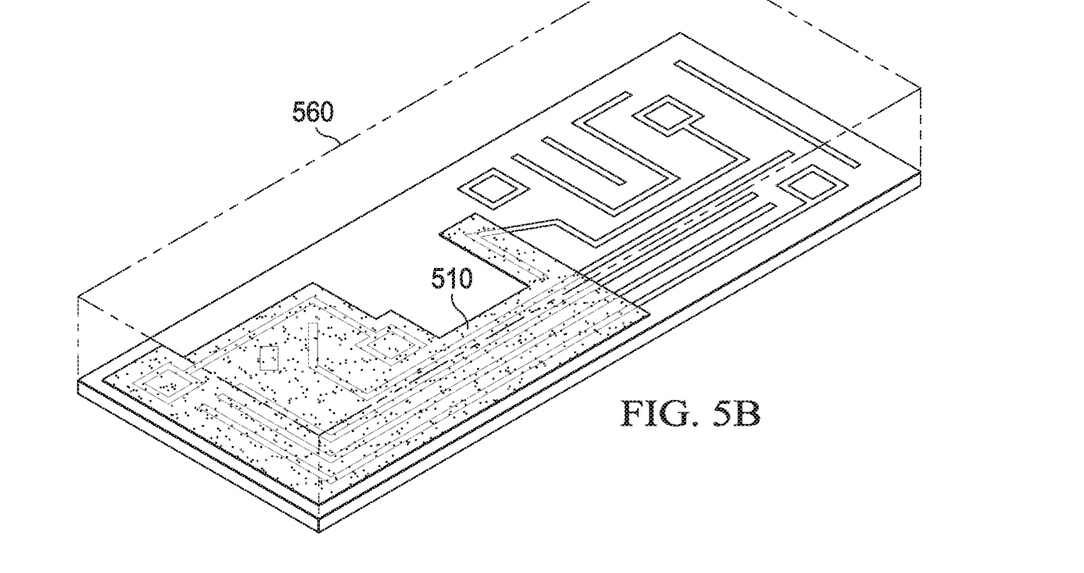

FIG. 5B shows one of the circuit boards 530, 532, 534, 536 covered with a packaging protection layer 560 to form a packaged semiconductor die.

FIGS. 6A-6E illustrate in cross sectional views the major steps to manufacture a packaged semiconductor die with a passivated copper structure. In FIGS. 6A-6E similar reference labels are used for similar elements shown in FIG. 1A, for clarity. For example, substrate 602 in FIGS. 6A-6E correspond to substrate 102 in FIG. 1A. The flow diagram of FIG. 7 illustrates corresponding method steps.

Figure 6A:
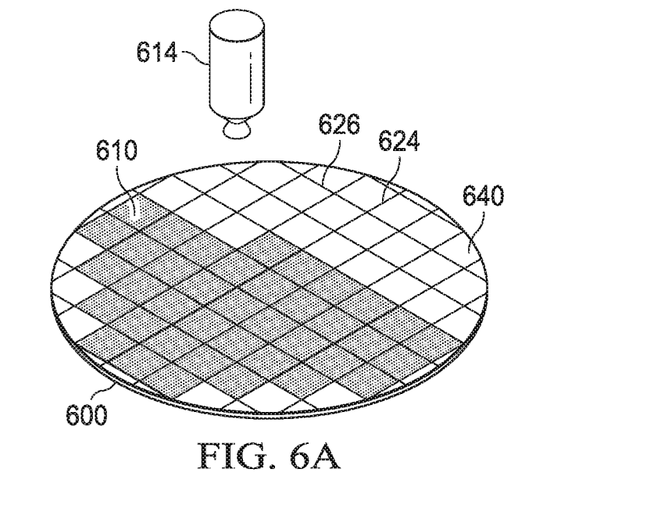
FIG. 6A is a projection view of a semiconductor wafer with copper leads coated with a copper corrosion inhibitor and being coated with a protection layer using ink-jet deposition.

FIG. 6A shows a semiconductor wafer 600 whose surface is covered with semiconductor dies 640. Horizontal scribe lanes 624 (as the semiconductor wafer 600 is oriented in FIG. 6A) and vertical scribe lanes 626 separate each semiconductor die 640 from adjacent dies. Exposed copper leads (not shown) on the surface of the dies 640 are first coated with a copper corrosion inhibitor in wafer form (step 701, FIG. 7) before being covered with a protection layer 610 using an ink-jet deposition tool 614 (step 703, FIG. 7). In an example, the copper corrosion inhibitor is BTA. In this application the entire surface of the wafer 600 except for bond pads 606 (see FIG. 6B) is covered with the protection layer 610.

Figure 6B:
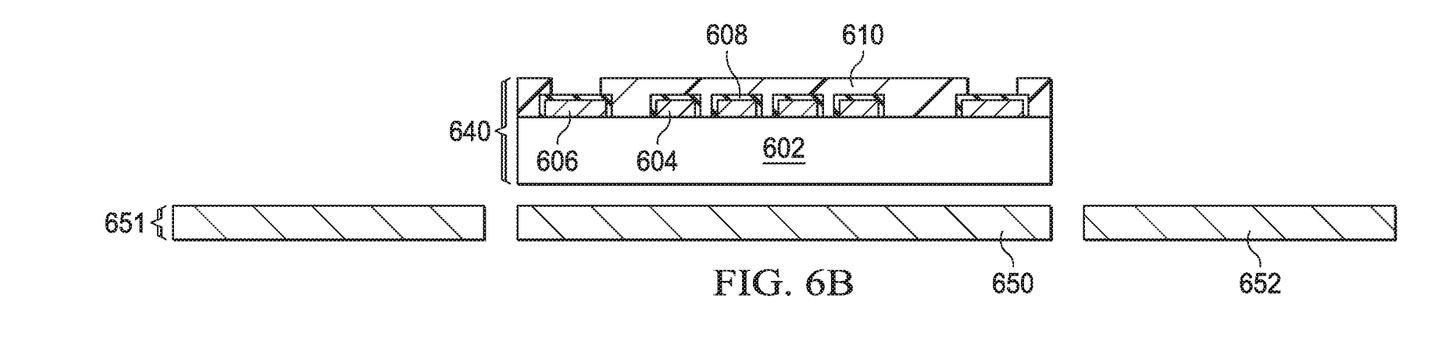
FIGS. 6B through 6E are cross sectional views of major steps in packaging a semiconductor die from the semiconductor wafer in FIG. 6A.
Figure 7:
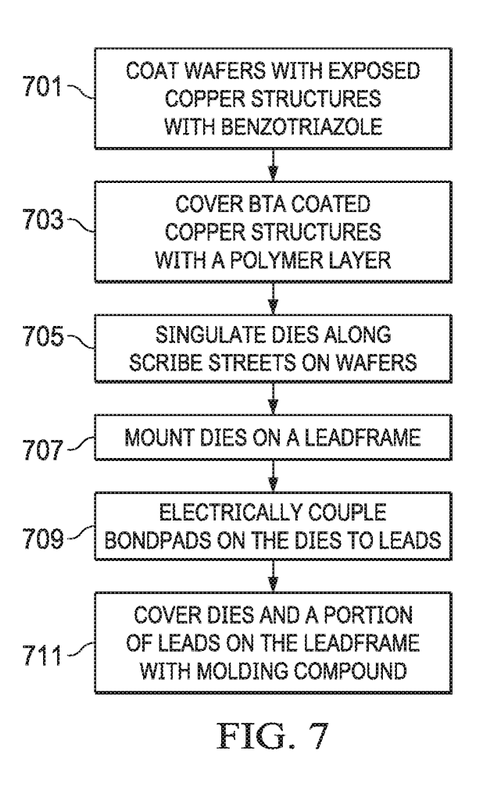
FIG. 7 is a flow diagram for the major steps in the corrosion protection of copper leads on semiconductor die and the packaging of the semiconductor die.

In FIG. 6B, singulated dies 640 (step 705, FIG. 7) are aligned to a die mount pad 650 on a substrate 651. In this application the substrate 651 is a lead frame, but the substrate 651 can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4.

Figure 6C:
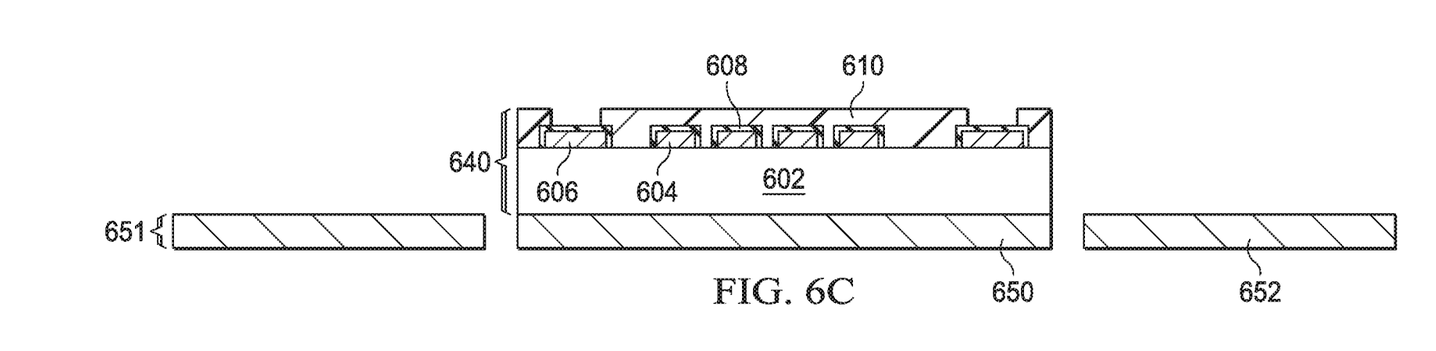

In FIG. 6C, the singulated dies 640 (step 707, FIG. 7) are mounted on the die mount pad 650.

Figure 6D:
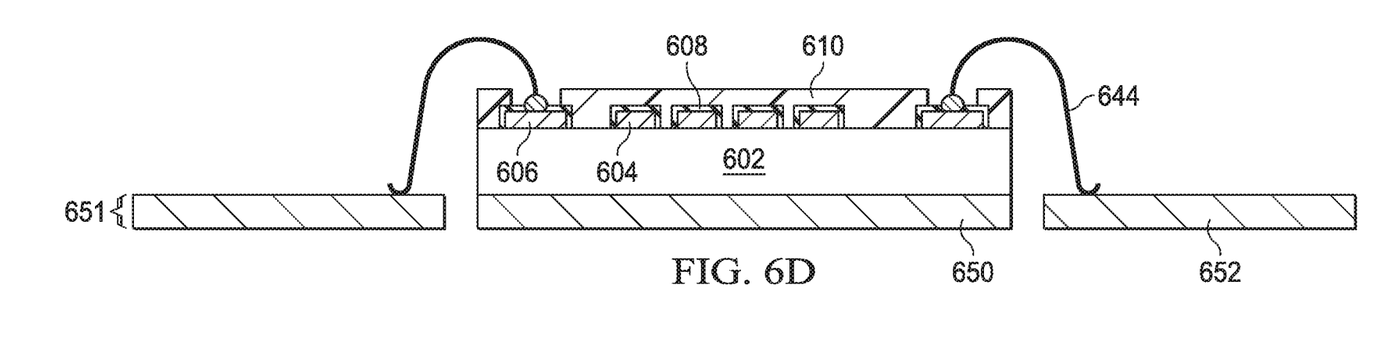
Figure 6E:
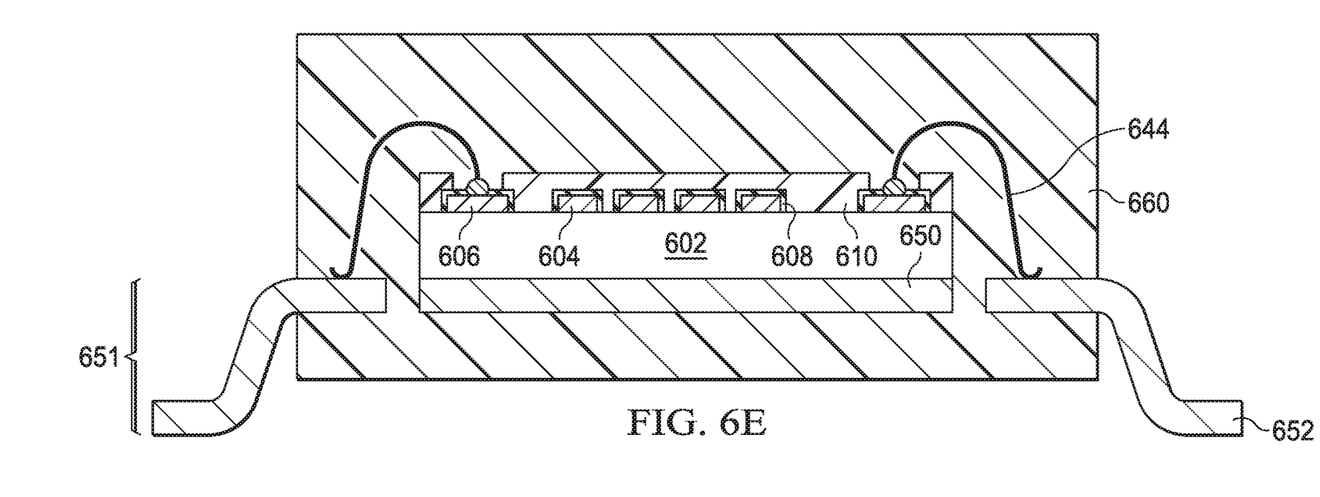

In FIG. 6D, bond pads 606 on the dies 640 are electrically connected to leads 652 on the leadframe 651 with a conductor 644 (step 709, FIG. 7). In FIG. 6D the conductor 644 is a bond wire. In an alternative example, ribbon bonds can be used, In FIG. 6E, the dies 640, the conductors 644, and portions of the leads 652 and leadframe 651 are covered with a mold compound 660 such as a filled epoxy (see step 711, FIG. 7). Note that in FIG. 6E, the leads 652 are shown with a downset shape for use in a surface mounting arrangement.

Cross sections in FIGS. 8A-8G illustrate example steps to manufacture a packaged semiconductor die with a passivated copper structure. In FIGS. 8A-8G similar reference labels are used for similar elements shown in FIG. 1A, for clarity. For example, substrate 802 in FIGS. 8A-8G correspond to substrate 102 in FIG. 1A. The flow diagram of FIG. 9 illustrates corresponding method steps.

Figure 8A:
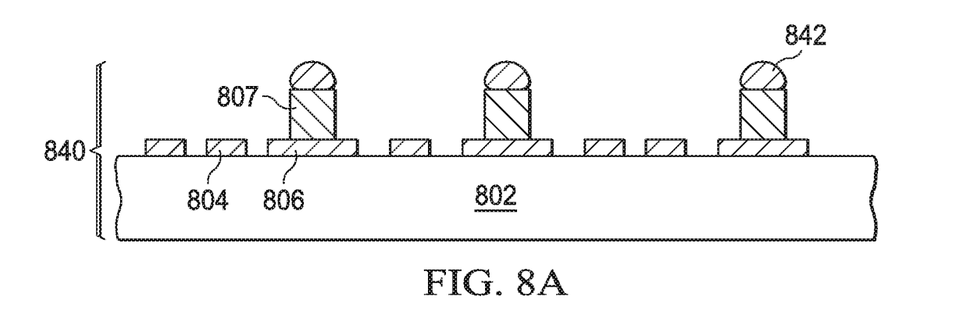
FIGS. 8A through 8D are cross sectional views of major steps in protecting copper posts and copper leads on a semiconductor substrate.
Figure 9:
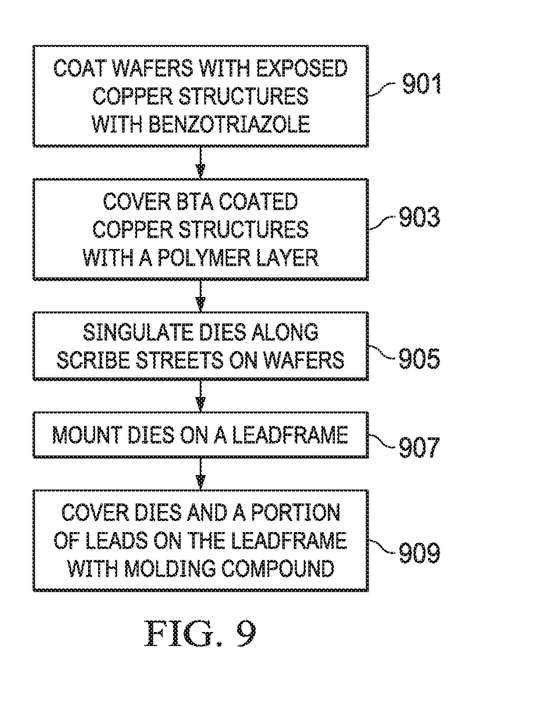
FIG. 9 is a flow diagram of the major steps in the corrosion protection of copper leads on a semiconductor substrate and the packaging of the semiconductor substrate.

FIG. 8A shows a semiconductor die 840 with copper posts 807 capped with solder 842 on the bond pads 806. The copper posts can be copper pillars or copper bumps. The bond pads 806 provide electrical connections to the semiconductor die which can contain a resistor, capacitor, diode, power transistor, or a complex integrated circuit. The semiconductor die 840 can be one of many covering the surface of a semiconductor wafer (see 600, FIG. 6A)

Figure 8B:
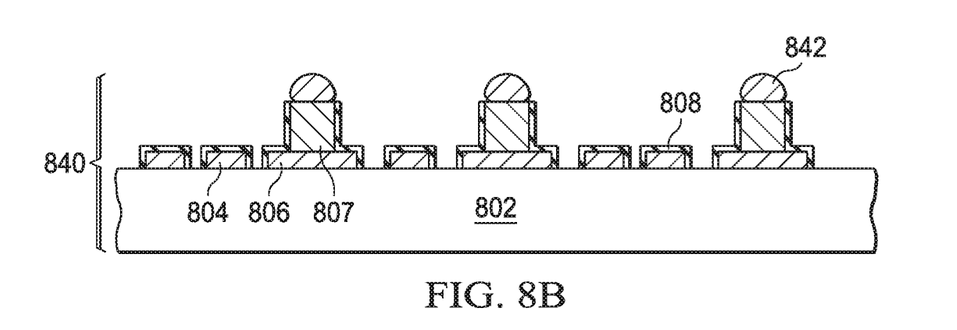

FIG. 8B shows the semiconductor die 840 with the exposed copper surfaces coated with copper corrosion inhibitor 808. (Step 901, FIG. 9)

Figure 8C:
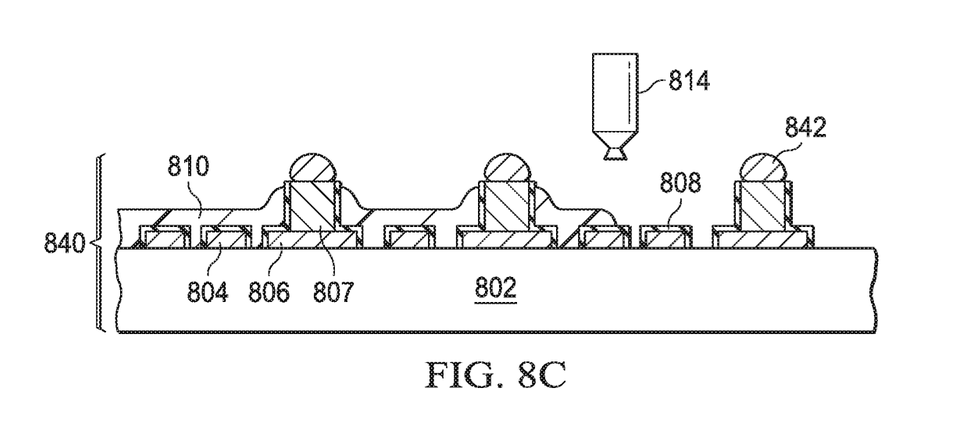
Figure 8D:
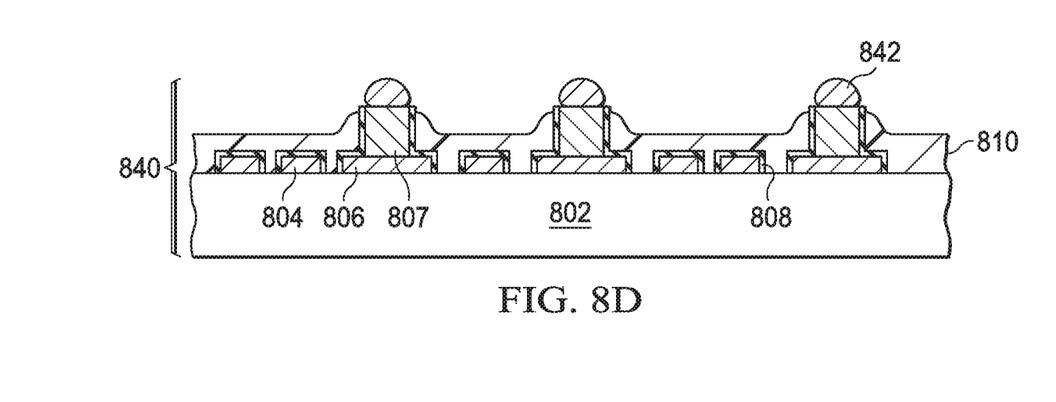

FIGS. 8C and 8D, show the semiconductor die 840 with the surface of the die 840 and the surface of the copper corrosion inhibitor 808 covered with a protection layer 810 deposited using an ink-jet deposition tool 814. (Step 903, FIG. 9). The protection layer can be a polymer ink such as a polyimide ink, a thermally curable epoxy-based polymer ink, a UV-curable acrylate ink, a silicone ink, a bismaleimide ink, and a polybenzoxazole ink. It is preferred that a polymer with a modulus less than 3.4 GPa and more preferred less than 2 GPa be used, to avoid applying undo stress on the semiconductor die 840. A thickness of the protection layer 810 can be in the range of about 2 μm to 35 μm. Thinner layers can be used, for example, in a range of 2 um to about 10 um or to 20 μm. Preferably a single pass deposition is used to increase throughput, however, thicker layers can require additional deposition passes.

Figure 8E:
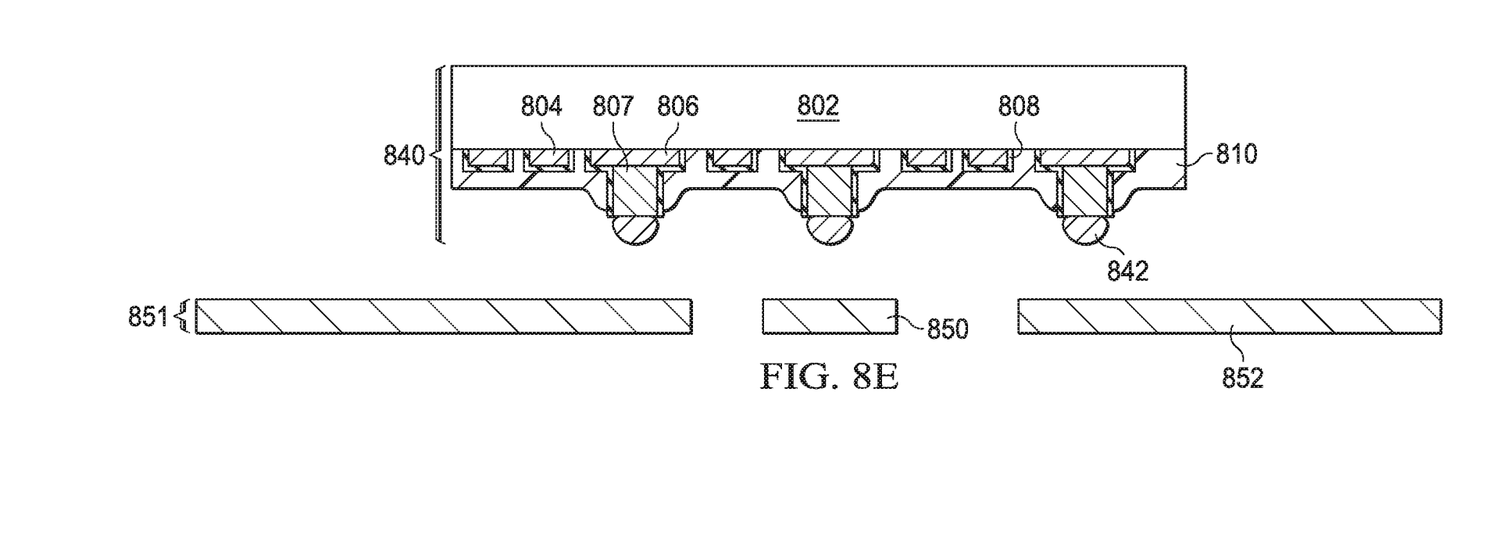
FIGS. 8E through 8G are cross sectional view of major steps in packaging the semiconductor substrate in FIG. 8D.

In FIG. 8E, the semiconductor die 840 is inverted and the solder capped copper posts 807 are aligned to leads 852 on a substrate 851 (step 905, FIG. 9). In this application the substrate 851 is a lead frame, but the substrate 851 can also be tape based and film based substrates carrying conductors; ceramic substrates, laminate substrates with multiple layers of conductors and insulator layers; and printed circuit board substrates of ceramic, fiberglass or resin, or glass reinforced epoxy substrates such as FR4.

Figure 8F:
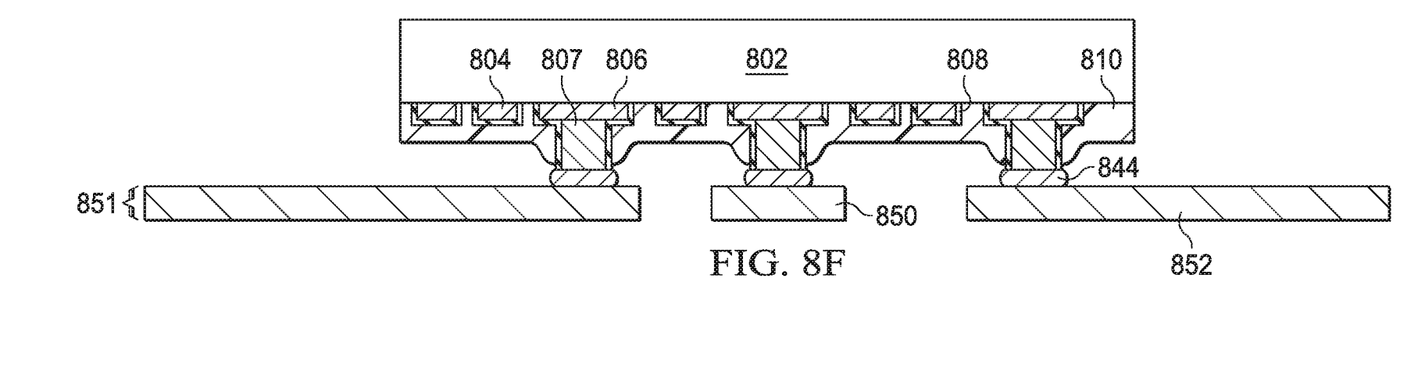

In FIG. 8F, the singulated semiconductor dies 840 (step 907, FIG. 9) are mounted on the lead frame 851 by forming solder bonds 844 between the solder capped copper posts 807 and the leads 852. In an example arrangement, the process can stop here, using the protection layer 810 as the final layer. This process can be part of a wafer level chip scale package (WLCSP) process.

Figure 8G:
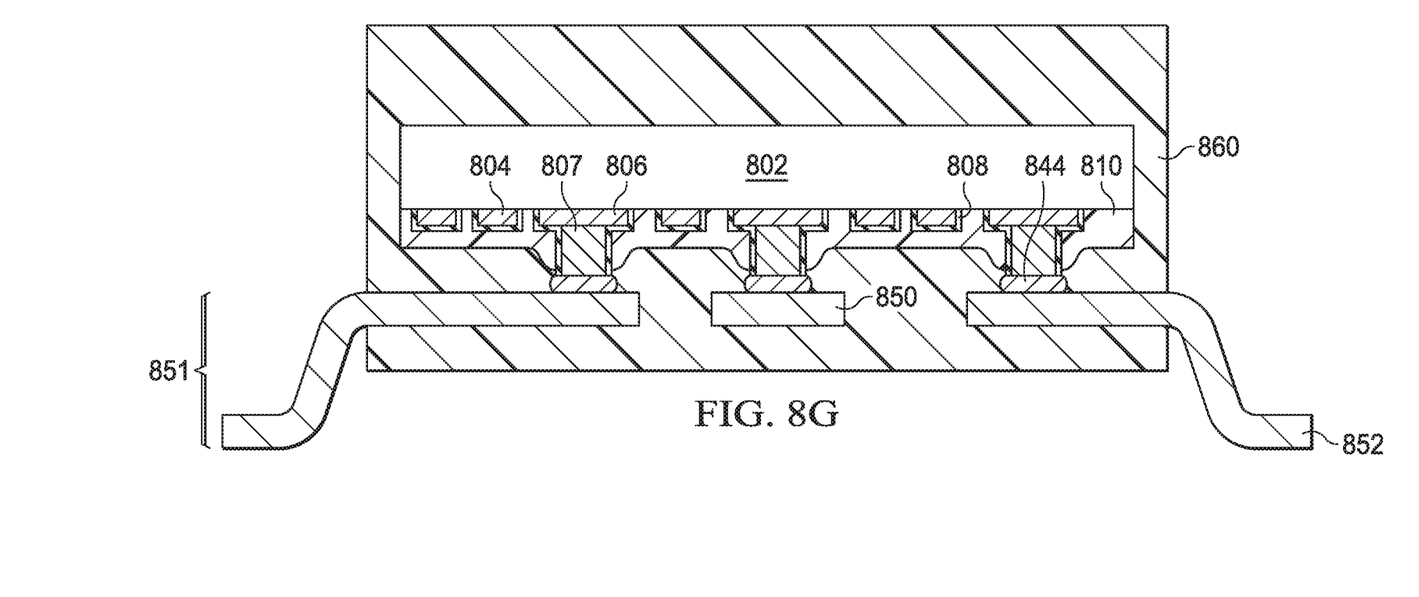

In FIG. 8G, the semiconductor dies 840, the lead frame 851 and portions of the leads 852 are covered with a mold compound 860 such as a filled epoxy. (See step 911, FIG. 9). In some alternative arrangements, the mold compound 860 can be omitted and the protection layer 810 can form the final layer over the dies 840. In some alternatives, liquid resin can be used instead of a filled epoxy, and the liquid resin can be applied using spin coating or spray coating, while a filled epoxy can be formed using transfer molding, for example starting with a solid mold compound that is then heated to a liquid state. A solid resin thermoset mold compound can be used with a high filler ratio, for example 80-90%; liquid resin mold compounds can be used with filler ratios of 50-60%.

The copper corrosion inhibitor 808 and protection layer 810 allows completed semiconductor dies 840 to be exposed to air for prolonged periods without the copper structures corroding, and in the arrangements the protection layer 810 protects the copper corrosion inhibitor 808 from being damaged and the damage then exposing the underlying copper to air during handling of the semiconductor dies 840. The protected copper corrosion inhibitor layer improves reliability of packaged semiconductor dies by greatly reducing or eliminating the corrosion. The protected copper corrosion inhibitor layer prevents corrosion on assemblies that have exposed copper structures during manufacturing steps.

Modifications are possible in the described arrangements, and other alternative arrangements are possible within the scope of the claims.

What is claimed is:

1. An assembly, comprising:
   copper structures on a substrate;
   a copper corrosion inhibitor layer coating at least portions of the copper structures; and
   a protection layer less than 35 μm thick coating the copper corrosion inhibitor layer.

2. The assembly of claim 1, wherein the copper corrosion inhibitor layer further comprises an azole.

3. The assembly of claim 2, wherein the copper corrosion inhibitor layer further comprises benzotriazole (BTA).

4. The assembly of claim 1, wherein the copper corrosion inhibitor layer further comprises one selected from a group consisting essentially of: an azole, benzotriazole (BTA), N-phenyl-1 4-phenylenediamine (NPPD), amino acids, cysteine, valine, glycine, arginine, lysine, triphenylmethane, rosaniline chloride, fuchsin acid sodium salt; thiole groups, phosphate groups, triethyl phosphate, triphenyl phosphate, and derivatives and combinations thereof.

5. The assembly of claim 1, wherein the substrate is one selected from a group consisting essentially of: a film-based substrate carrying conductors; a ceramic substrate, a laminate substrate with multiple layers of conductors and insulators; a lead frame, a semiconductor substrate, and a printed circuit board substrate.

6. The assembly of claim 1, wherein the assembly is a semiconductor die and wherein the semiconductor die is covered with a packaging protection layer.

7. The assembly of claim 1, wherein the assembly is a semiconductor die.

8. The assembly of claim 1, wherein the assembly is a semiconductor die and wherein the semiconductor die is mounted on the substrate that is a lead frame and the semiconductor die and the lead frame are at least partially covered with mold compound.

9. The assembly of claim 1, wherein the assembly is a printed circuit board.

10. The assembly of claim 1, wherein the protection layer is a polymer that is one selected from a group consisting essentially of: a polyimide, an epoxy-based polymer, a silicone, and a UV-curable acrylate polymer.

11. The assembly of claim 1, wherein the protection layer is ink jet deposited and has a convex sidewall.

12. The assembly of claim 1, wherein the protection layer has a sidewall that is straight and within 20 degrees of vertical, indicative of screen-print deposition or of and slit print deposition.

13. The assembly of claim 1, wherein the copper corrosion inhibitor layer is a BTA layer with a molecular weight in a range from 119 g/mole to about 200 g/mole.

14. The assembly of claim 1, wherein the copper corrosion inhibitor layer is a BTA layer that is stable to a temperature of about 260° C.

15. The assembly of claim 1, wherein the protection layer has a modulus less than 3.4 GPa.

16. The assembly of claim 1, wherein the protection layer has a thickness between 2 µm and 20 µm.

17. The assembly of claim 1, wherein the protection layer has a thickness between 2 µm and 10 µm.

18. A packaged semiconductor device, comprising:
a semiconductor die mounted on a substrate;
copper structures on the semiconductor die at least partially coated with a copper corrosion inhibitor layer;
a protection layer less than 35 µm thick coating the copper corrosion inhibitor layer; and
the semiconductor die, the protection layer, and at least a portion of the substrate coated with mold compound.

19. The packaged semiconductor device of claim 18, wherein the substrate is one selected from a group consisting essentially of: a lead frame, a film-based substrate carrying conductors; a ceramic substrate, a laminate substrate with multiple layers of conductors and insulators; a fiberglass substrate, an FR4 substrate, a semiconductor substrate, a tape-based substrate, a pre-molded lead frame, a molded interconnect substrate, and a printed circuit board.

20. The packaged semiconductor device of claim 18, wherein the semiconductor die is mounted on a lead frame, and the semiconductor die and a portion of the lead frame are covered with mold compound.

21. The packaged semiconductor device of claim 18, wherein the protection layer is a polymer that is one selected from a group consisting essentially of: a polyimide, an epoxy-based polymer, a silicone, and a UV-curable acrylate polymer.

22. The packaged semiconductor device of claim 18, wherein the protection layer is ink jet deposited and a sidewall on the protection layer has a convex shape.

23. The packaged semiconductor device of claim 18, wherein a sidewall on the protection layer is straight and within 20 degrees of vertical.

24. The packaged semiconductor device of claim 18, wherein the copper corrosion inhibitor layer is an azole.

25. The packaged semiconductor device of claim 24, wherein the azole of the copper corrosion inhibitor layer is BTA that has a molecular weight greater than about 119 g/mole.

26. The packaged semiconductor device of claim 18, wherein the copper corrosion inhibitor layer is stable to a temperature of about 260° C.

27. A semiconductor device, comprising:
a wafer including a plurality of semiconductor dies spaced from one another, each semiconductor die having a copper structure on a circuit side surface,
a copper corrosion inhibitor layer over the copper structure; and
a protective layer over the copper corrosion inhibitor layer having a thickness less than 35 µm thick.

28. The semiconductor device of claim 27, wherein the protection layer is a polymer that is one selected from a group consisting essentially of: a polyimide, an epoxy-based polymer, a silicone, and a UV-curable acrylate polymer.

29. The semiconductor device of claim 27, wherein the protection layer is ink jet deposited and a sidewall on the protection layer has a convex shape.

30. The semiconductor device of claim 27, wherein a sidewall on the protection layer is straight and within 20 degrees of vertical.

31. The semiconductor device of claim 27, wherein the copper corrosion inhibitor layer is one selected from a group consisting essentially of: an azole, benzotriazole (BTA), N-phenyl-1, 4-phenylenediamine (NPPD), amino acids, cysteine, valine, glycine, arginine, lysine, triphenylmethane, rosaniline chloride, acid fuchsin sodium salt; thiole groups, phosphate groups, triethyl phosphate, triphenyl phosphate, and derivatives and combinations thereof.

32. The semiconductor device of claim 27, wherein the protection layer has a modulus less than 3.4 GPa.

33. A method for passivating a copper structure, comprising:
passivating a surface of a copper structure on a substrate with a copper corrosion inhibitor layer; and
depositing a protection overcoat layer with a thickness less than 35 µm over a surface of the copper corrosion inhibitor layer.

34. The method of claim 33, further comprising depositing the protection overcoat layer using ink-jet deposition.

35. The method of claim 33, further comprising depositing the protection overcoat layer using one selected from screen print deposition and slit print deposition.

36. The method of claim 33, further comprising depositing the protection overcoat layer with the thickness between 2 µm and 20 µm.

37. The method of claim 33, further comprising depositing the protection overcoat layer that is one selected from a group consisting essentially of: polyimide; a thermally curable epoxy-based polymer; a UV-curable acrylate polymer; and a silicone.

38. The method of claim 33 further comprising depositing the protection overcoat layer wherein the protection overcoat layer has a modulus less than 3.4 GPa.

\* \* \* \* \*